(12) United States Patent
Van Der Sude et al.

(10) Patent No.: US 10,873,011 B2
(45) Date of Patent: Dec. 22, 2020

(54) SEMICONDUCTOR DIE HAVING A FIRST LIGHT-EMITTING DIODE AND A SECOND LIGHT-EMITTING DIODE

(71) Applicant: Lumileds Holding B.V., Schiphol (NL)

(72) Inventors: Arjen Van Der Sude, Eindhoven (NL); Nicola Pfeffer, Eindhoven (NL); Pieter Johannes Quintus Van Voorst Vader, Son (NL); Peter Schmidt, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/516,369

(22) Filed: Jul. 19, 2019

(65) Prior Publication Data
US 2020/0028035 A1    Jan. 23, 2020

(30) Foreign Application Priority Data
Jul. 19, 2018  (EP) ..................................... 18184388

(51) Int. Cl.
*H01L 33/50* (2010.01)
*F21K 9/90* (2016.01)
*H01L 27/15* (2006.01)

(52) U.S. Cl.
CPC .............. *H01L 33/504* (2013.01); *F21K 9/90* (2013.01); *H01L 27/15* (2013.01); *H01L 2933/0041* (2013.01)

(58) Field of Classification Search
CPC ................... H01L 33/504; H01L 27/15; H01L 2933/0041; H01L 2924/12041; H01L 2924/01015; H01L 25/0753; H01L 33/50; H01L 33/501; H01L 33/502; H01L 2924/405; H05B 47/155; F21K 9/60; F21K 9/64; F21K 9/278
See application file for complete search history.

(56) References Cited

U.S. PATENT DOCUMENTS

| 5,324,962 | A | * | 6/1994 | Komoto | ............... H01L 25/0753 257/89 |
|---|---|---|---|---|---|
| 5,837,995 | A | * | 11/1998 | Chow | ..................... H04N 3/155 250/214 LS |
| 6,696,784 | B2 | * | 2/2004 | Yoshida | .............. H01L 25/0753 257/E25.02 |
| 7,723,736 | B2 | | 5/2010 | Lee et al. | |
| 7,847,303 | B2 | * | 12/2010 | Jung | ..................... F21V 23/009 257/89 |
| 8,482,663 | B2 | | 7/2013 | Farchtchian et al. | |

(Continued)

FOREIGN PATENT DOCUMENTS

| CN | 103199170 B | 8/2016 |
|---|---|---|
| DE | 102015114010 A1 | 3/2017 |
| JP | 2013-048162 A | 3/2013 |

*Primary Examiner* — Khiem D Nguyen
(74) *Attorney, Agent, or Firm* — Volpe Koenig (57) ABSTRACT

The invention describes a semiconductor die comprising at least a first light-emitting diode and a second light-emitting diode, wherein the first light-emitting diode comprises a first diode formed in a first die area and a first phosphor layer deposited over the first die area; the second light-emitting diode comprises a second diode and a second phosphor layer deposited over the second die area; the first diode and the second diode are electrically connected in anti-parallel; and wherein the optical properties of the second phosphor layer differ from the optical properties of the first phosphor layer.

15 Claims, 6 Drawing Sheets

(56) References Cited

U.S. PATENT DOCUMENTS

| | | | | |
|---|---|---|---|---|
| 9,159,885 | B2* | 10/2015 | Ouderkirk | H01L 33/50 |
| 9,496,472 | B2* | 11/2016 | Tischler | H01L 33/54 |
| 9,576,940 | B2* | 2/2017 | Kim | H01L 25/0753 |
| 2004/0217364 | A1* | 11/2004 | Tarsa | H01L 25/0753 |
| | | | | 257/89 |
| 2008/0230795 | A1 | 9/2008 | Dias | |
| 2008/0297644 | A1* | 12/2008 | Farchtchian | H01L 25/0753 |
| | | | | 348/340 |
| 2009/0108269 | A1 | 4/2009 | Negley et al. | |
| 2010/0219428 | A1* | 9/2010 | Jung | H01L 25/0753 |
| | | | | 257/89 |
| 2012/0193657 | A1 | 8/2012 | Von Malm et al. | |
| 2014/0328056 | A1* | 11/2014 | Lee | H01L 33/504 |
| | | | | 362/231 |
| 2014/0367711 | A1* | 12/2014 | Bibl | H01L 24/73 |
| | | | | 257/89 |
| 2016/0087180 | A1* | 3/2016 | Tischler | H01L 24/96 |
| | | | | 257/98 |
| 2016/0278174 | A1* | 9/2016 | Chen | H01L 24/04 |
| 2018/0175265 | A1* | 6/2018 | Kim | H01L 33/60 |
| 2018/0182945 | A1* | 6/2018 | Shimabukuro | H01L 33/62 |

* cited by examiner

SEMICONDUCTOR DIE HAVING A FIRST LIGHT-EMITTING DIODE AND A SECOND LIGHT-EMITTING DIODE

FIELD OF THE INVENTION

The invention describes a semiconductor die, a method of manufacturing a semiconductor die, and an electronic device with an imaging module comprising such a semiconductor die.

BACKGROUND

A light-emitting diode (LED) comprises a semiconductor junction and can therefore be damaged by electrostatic discharge (ESD) during handling in manufacturing stages, but also when part of an electric circuit. One way of avoiding ESD damage to an LED or to a string of LEDs is to connect a protective diode in anti-parallel (also referred to as inverse-parallel). In some realisations, the protective diode is a Zener diode. Such a protective diode is generally referred to as an ESD protection diode or a transient voltage suppressor (TVS) diode. Two such anti-parallel diodes are connected so that their polarities are reversed, i.e. the anode of one diode is connected to the cathode of the other diode. The unintentionally reverse-biased LED is then protected by its forward-biased TVS diode ("protection diode"). A monolithic die can be manufactured to include an LED with its own antiparallel protective diode, i.e. the two semiconductor diodes are formed on a common substrate in the same manufacturing process.

In general, the only purpose of the TVS diode in such an anti-parallel arrangement is to divert electric current from the reverse-biased LED in the rare event of an ESD transient voltage. The TVS diode only fulfils this one function for a specific type of event that generally only seldom occurs. In such a prior art device, provision of a dedicated but functionally limited TVS protection diode is an unavoidable cost factor. Particularly in space-constrained compact devices, a TVS diode uses valuable resources such as die space, electrical contacts, etc.

Therefore, it is an object of the invention to provide an electric circuit that avoids the problems outlined above.

SUMMARY

The object of the invention is achieved by the semiconductor die of claim 1; by the method according to claim 11 of manufacturing a semiconductor die; and by the electronic device of claim 14.

According to the invention, the semiconductor die comprises at least a first light-emitting diode and a second light-emitting diode. The first light-emitting diode comprises a first p-n junction diode formed in a first die area and a first phosphor layer deposited over the first die area, and the second light-emitting diode comprises a second p-n junction diode formed in a second die area, and a second phosphor layer deposited over the second die area. In the inventive semiconductor die, the first diode and the second diode are connected in anti-parallel, and the optical properties of the second phosphor layer differ from the optical properties of the first phosphor layer.

The optical properties ("emission properties") of a phosphor layer—i.e. whether it is up-converting or down-converting, the wavelengths it absorbs and the wavelengths it emits—are largely determined by the choice of phosphor material(s). The first and second phosphor coatings can have different or similar layer thicknesses. The coatings can be patterned onto the die using a suitable technique such as electrophoretic deposition, phosphor printing, etc. Alternatively, the phosphor can be included in a ceramic or glass carrier, from which platelets can be cut and placed onto the respective die areas in a pick-and-place process.

In a preferred embodiment of the invention, the layer structure of both p-n junction diodes is essentially identical, so that both diodes result from the same manufacturing process. In a particularly preferred embodiment of the invention, diodes may be realised using InGaN as the light-emitting layer, since InGaN is characterized by a short wavelength, resulting in the excitation of both phosphor materials (e.g. visible and infrared). Alternatively, the diodes may be realised with AlGaAs/GaAs as the light-emitting layer, since this material inherently emits in the infrared range and the other wavelengths could be up-converted in an appropriate phosphor layer which may contain appropriate crystals and/or nanoparticles.

In the context of the invention, the term "light-emitting diode" is to be understood as the combination of a p-n junction diode and the phosphor layer deposited on that p-n junction diode. The phosphor layer may be understood to comprise a single phosphor material or a combination of several phosphor materials. The phosphor layer performs wavelength conversion, i.e. it will absorb electromagnetic radiation emitting by the p-n junction diode and emit electromagnetic radiation at a different wavelength. In the following, a phosphor layer may be assumed to have a down-converting effect, i.e. the wavelength of the light emitted by a phosphor is longer than the wavelength of the electromagnetic radiation emitted by its p-n junction diode. Of course, the use of an up-converting phosphor layer is not ruled out.

The invention is based on the insight that, in a circuit comprising anti-parallel connected diodes, each of the diodes can provide ESD protection for the other diode, while each diode can also have a function other than ESD protection. The inventive semiconductor device therefore has two LEDs, each with a specific function other than ESD protection, i.e. each LED of the antiparallel pair has a specific application function as well as acting providing ESD protection for the other LED. For these reasons, the inventive semiconductor die can be described as a dual-function die. In the inventive semiconductor die, realizing each LED to fulfil a function other than ESD protection means that TVS protection is no longer an unavoidable cost factor; instead TVS protection is provided in the guise of a second application function.

According to the invention, the method of manufacturing a semiconductor die comprises the steps of forming a first p-n junction diode in a first die area and forming a second p-n junction diode in a second die area such that the first diode and the second diode are connected in anti-parallel; depositing a first phosphor layer over the first die area; and depositing a second phosphor layer over the second die area, wherein the composition of the second phosphor layer differs from the composition of the first phosphor layer.

In a prior art device that comprises an LED and an anti-parallel TVS diode, the light-emitting diode takes up most of the die area, and the TVS diode takes up only a small fraction of the die area. For reasons of economy therefore, the entire die surface is usually coated with a layer comprising a single phosphor composition even though the phosphor over the TVS diode is effectively not used. A TVS diode comprising AlGaAs/GaAs will generally emit in the near-infrared range. Therefore, even if the LED were to be reverse-biased, the electromagnetic radiation emitted by this TVS diode would not cause the phosphor layer to luminesce.

In the inventive semiconductor die, a different phosphor material is used to cover the die area dedicated to the second p-n junction diode. Without significant alteration to the epitaxial deposition process or the die dimensions, it is possible to obtain a dual-function device simply by using a different phosphor material to cover the die area of the second p-n junction diode, and driving either the first LED or the second LED as appropriate. Whenever the second LED is activated (i.e. the first LED is reverse-biased), the electromagnetic radiation emitted by the second p-n junction diode will be converted by the second phosphor layer to a "useful" wavelength.

According to the invention, the electronic device comprises an imaging module, and the imaging module comprises an embodiment of the inventive semiconductor die. Because the semiconductor die is realized to fulfil two functions (in addition to ESD protection), the imaging module of the inventive electronic device can be manufactured in a favourably compact manner. Any pair of two LEDs of the semiconductor die each perform a specific function, but only two terminals or contacts are required (instead of four) since the LEDs are connected in anti-parallel. At the same time, each LED is protected from ESD damage from its opposite-polarity "partner" LED.

The dependent claims and the following description disclose particularly advantageous embodiments and features of the invention. Features of the embodiments may be combined as appropriate. Features described in the context of one claim category can apply equally to another claim category.

In a particularly preferred embodiment of the invention, the first light-emitting diode and the second light-emitting diode emit electromagnetic radiation in different wavelength ranges. For example, the diode/phosphor combination of the first light-emitting diode can be realised to emit in the visible range, while the diode/phosphor combination of the second light-emitting diode can be realised to emit in the infrared or near-infrared range. Preferably, the difference in wavelength between the electromagnetic radiation emitted by the first diode and the electromagnetic radiation emitted by second diode comprises at least 100 nm, whereby this wavelength difference may be understood to be measured between the midpoints of each range. For example, in the case of a visible-emitting first diode with peak at 550 nm and an infrared-emitting second diode with peak at 850 nm, the wavelength difference comprises 300 nm. In the case of a visible-emitting first diode with peak at 550 nm and an infrared-emitting second diode with a peak at 940 nm, the wavelength difference comprises 390 nm.

The p-n junction diodes of the inventive semiconductor die can be manufactured depending on the intended application in which the die will be used, i.e. the materials and thicknesses of the shared epitaxial layers can be selected for the two anti-parallel connected diodes according to the intended emission wavelengths of both diodes. For example, if the semiconductor die is to be used primarily as a light source, the first diode may be formed as a visible-range emitting light-emitting diode, while the second diode may be formed as a TVS diode, with the added functionality of emitting in the near infrared, using the same epitaxial layers. The first diode may use 80% or more of the entire die, while the second diode is realised in the remaining volume. The added functionality of the second diode (whose primary function is to provide TVS protection to the first LED) can be achieved by choosing a suitable phosphor, for example a phosphor that converts blue wavelengths to infrared wavelengths. When the first or "main" diode is reverse-biased, the second diode is forward-biased and therefore "on", and the infrared light emitted by the second LED can be used for example as a focus-assist infrared light source of a camera arrangement, or as a detector of specific dies in a counterfeit detection arrangement.

If the first diode is used as a light source in the visible spectrum, the p-n junction can be realised to emit light in the wavelength range 380 nm-470 nm, and the phosphor layer applied to the first die area may comprise one or more down-converting phosphors that emit in the range 480 nm-800 nm.

In an alternative embodiment, both light-emitting diodes emit electromagnetic radiation in the visible spectrum. Such a device could be used as a dual colour flash with an appropriate firing schedule for the LEDs. Since the two emission surfaces are side by side, a suitable optics arrangement can be used, for example a "light recycling optics" that redirects wide-angle light into a more compact beam. Alternatively, a clear window, a diffuser, or any suitable collimator may be used, as will be familiar to the skilled person.

In a further embodiment, both light-emitting diodes emit electromagnetic radiation in different regions of the infrared spectrum. An application for such a device can be wavelength-selective Li-Fi or face recognition, iris recognition, etc. For example, the first LED emitting at 940 nm could be used for face recognition, and the second LED emitting at 850 nm can be used for iris recognition.

In another embodiment, the first diode emits in the visible spectrum, while the second diode emits in the near-infrared range. An up-converting phosphor applied to the first die area will emit in the ultraviolet (UV) range, while a down-converting phosphor applied to the second die area emits in the infrared (IR) range. Such a semiconductor die may find application in a forgery or counterfeit detection device. When forward-biased, the first diode can be used to illuminate printed matter to detect information encoded using a UV-fluorescent dye. When the second diode is forward-biased, it can be used to illuminate printed matter to detect any information encoded using an IR-fluorescent dye. In this way, a forgery that fails to contain the appropriate dyes in the relevant areas can easily be detected.

The manufacturing method can comprise steps to ensure the reliability of the semiconductor die and to ensure the best performance for the two applications. For example, the method may comprise a step of forming a separation layer between the first die area and the second die area to prevent cross-talk. Such a separation layer may be realised as a mirror, an absorbing layer, a scattering-reflection layer, etc.

As indicated above, the size of the first die area may be different from the size of the second die area. The sizes and dimensions of these areas may depend to a large extent on the intended application, which will determine the power required by the diodes of the anti-parallel pair. For example, if the semiconductor die will be used as a visible-spectrum light source of a camera flash with an added functionality as a focus-assist infrared light source, the first (visible-spectrum emitting) die area may be relatively large compared to the second (infrared emitting) die area. The relative sizes of the diode areas will generally depend on their power consumption. The first LED may occupy a relatively large rectangular portion of the overall die, while the second LED might be formed in the smaller remaining area to border the first LED on one, two, three or four sides.

The inventive semiconductor die is not restricted to a single pair of anti-parallel diodes. Equally, the semiconductor die can be manufactured to comprise two or more such pairs of anti-parallel connected diodes. In another kind of realization, a string of series-connected LEDs or a group or parallel-connected LEDs might be protected by a single TVS diode that is also realised as a functional LED as described.

The inventive semiconductor die is very suitable for use in a space constrained environment, for example in a mobile device such as a smartphone. The device housing need only be designed to include a single aperture to expose the two emission regions of the single semiconductor die. Furthermore, only two contact pads are required for the cathode and anode terminals of a diode pair. With a suitable multiplexer circuit, the two functions of the semiconductor die can be achieved with a single driver, since only one of the two diodes is ever active at any one time. Furthermore, since only two contact pads are required by the inventive semiconductor die package, the thermal design aspect is simplified compared to an arrangement of two individual LED packages. Two such separate LED packages require four contact pads that must be separated by minimum gaps for solderability requirements, thereby sacrificing active thermal contact area. The most compact arrangement of two such individual LED packages will always require more than two contact pads will suffer from poorer thermal performance.

As indicated above, the inventive semiconductor die can be used to advantage in various kinds of application. For example, it is known to design a camera flash to incorporate a visible-emitting LED to illuminate a scene, and an IR-emitting diode for a focus-assist function. Such a camera flash can be realised using an embodiment of the inventive semiconductor die, realized with a visible-emitting first LED and an infrared-emitted second LED. During the focus-assist phase of an imaging sequence, the driver addresses the IR-emitting LED so that the visible-emitting first LED is reverse-biased and therefore inactive. During the flash phase of the imaging sequence, the driver addresses the visible-emitting diode, so that the IR-emitting LED is reverse-biased and therefore inactive.

The inventive semiconductor die can also be incorporated in a dual-colour camera flash, e.g. a flash that uses two slightly different white hues in order to achieve a more natural illumination effect.

Similarly, a mobile device such as a smartphone might include an embodiment of the inventive semiconductor die and use the IR-diode of the semiconductor die to fulfil an IR remote control function, a Li-Fi function, etc.

The inventive semiconductor die could also be incorporated in a device that performs full-spectrum spectral analysis. In such an embodiment, one of the LEDs can emit in the visible range including the UV spectrum, while the other LED can emit in the infrared range. As mentioned above, such a device can be used to distinguish printed forgeries or counterfeit currency, if the ink used to print the genuine documents or currencies incorporates phosphors that fluoresce in those range(s). The inventive semiconductor die could be used for near infrared spectroscopy to perform chemical analysis of a test object, combined with visible image analysis for object recognition.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWINGS

In the drawings, like numbers refer to like objects throughout. Objects in the diagrams are not necessarily drawn to scale.

DETAILED DESCRIPTION OF THE EMBODIMENTS

Figure 1:
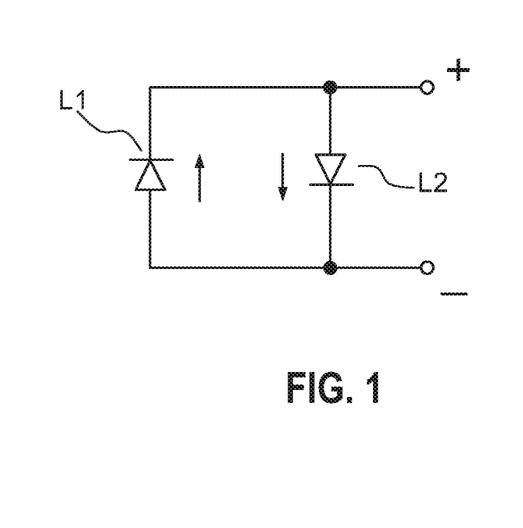
FIG. 1 shows a circuit diagram of an anti-parallel diode pair.
Figure 2:
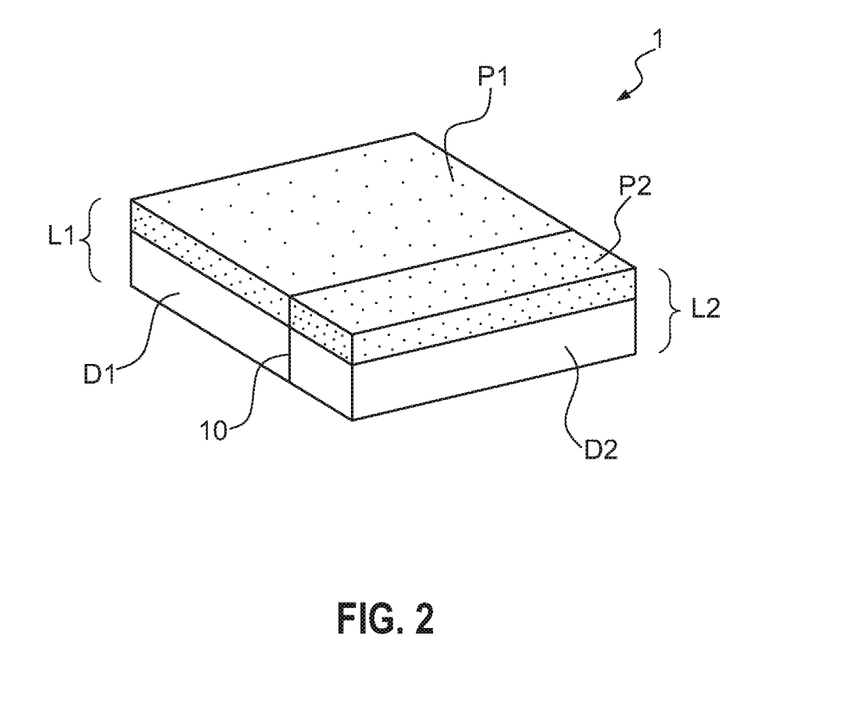
FIG. 2 shows an embodiment of the inventive semiconductor die.

FIG. 1 shows a first embodiment of the invention, in which pair of light-emitting diodes L1, L2 are arranged in an anti-parallel configuration. The anti-parallel pair may be assumed to be formed as a single die 1 (or "monolithic" die) as illustrated in FIG. 2. A first light-emitting diode L1 is formed by applying a first phosphor coating P1 over a first p-n junction diode D1 formed in a first die area, while the second light-emitting diode L2 is formed by applying a second phosphor coating P2 over a second p-n junction diode D2 formed in the remaining die area. The material compositions of the p-n junction diodes D1, D2 and the phosphor layers P1, P2 are chosen so that the light emitted when the first p-n junction D1 is forward-biased is in a different wavelength range than the light emitted when the second p-n junction D2 is forward-biased.

FIG. 2 also indicates a separation layer 10 between the diodes D1, D2 to prevent cross-talk. The separation layer may be realised as a mirror, an absorbing layer, a scattering-reflection layer, etc., as will be known to the skilled person.

Figure 3:
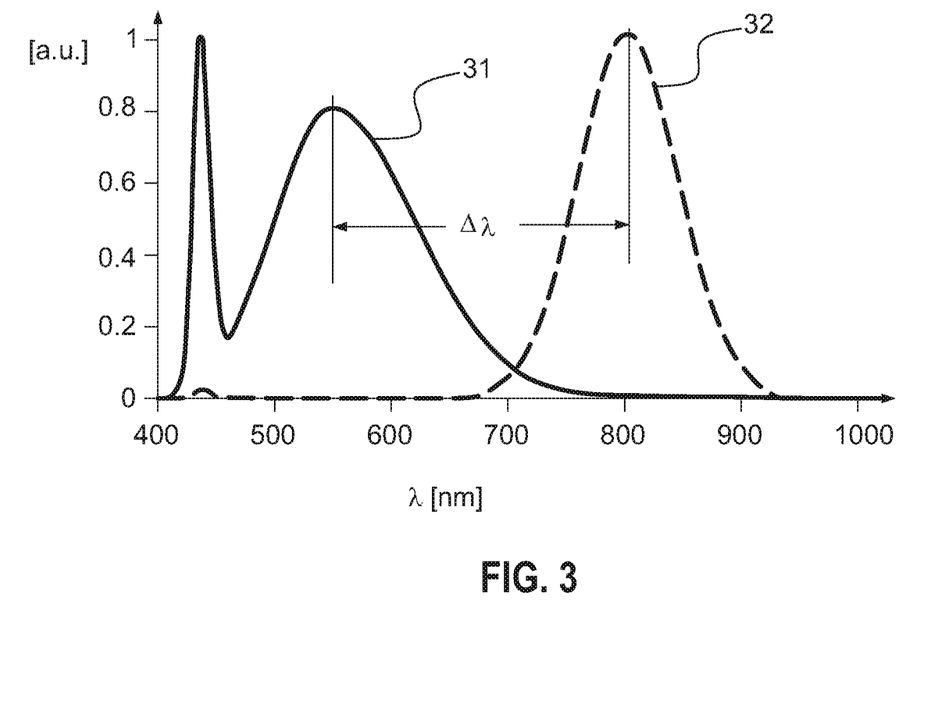
FIG. 3 shows an exemplary spectrum pair for an embodiment of the inventive semiconductor die.

FIG. 3 shows exemplary emission spectra of an embodiment of the inventive semiconductor die, with wavelength λ (in nanometres [nm]) along the X-axis, and emission amplitude (in arbitrary units [au]) along the Y-axis. The first light-emitting diode L1 is realised to emit light in the visible spectrum when forward-biased, and the first emission spectrum 31 covers wavelengths in the range 450-650 nm. The second light-emitting diode L2 is realised to emit light in the infrared range when forward-biased, and the second emission spectrum 32 covers wavelengths in the range 700-900 nm. In this exemplary embodiment, the wavelength difference Δλ (measured between the range midpoints) is about 250 nm.

Figure 4:
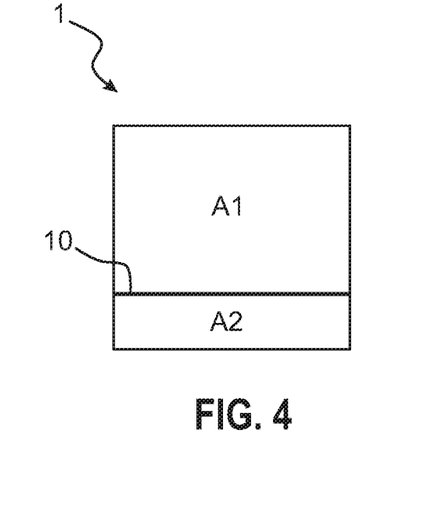
FIGS. 4 and 5 show simplified plan views onto embodiments of the inventive semiconductor die.
Figure 5:
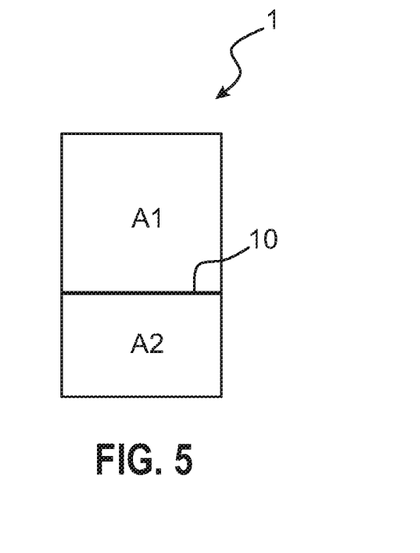

FIGS. 4 and 5 show simplified plan views onto embodiments of the inventive semiconductor die 1. FIG. 4 shows an embodiment similar to FIG. 2 above, in which the area A1 dedicated to the first diode D1 is about 75% of the total die area, while the TVS diode (e.g. also doubling up as an infrared diode when the first LED is reverse-biased) occupies the remaining 25% of the total die area. FIG. 5 shows an embodiment in which the area A1 dedicated to the first diode D1 is about 60% of the total die area, while the second diode D2 occupies the remaining 40% of the total die area. This realisation may be suitable for an application in which the LEDs are used for UV/IR counterfeit detection, or in a dual-colour flash, for example.

Figure 6:
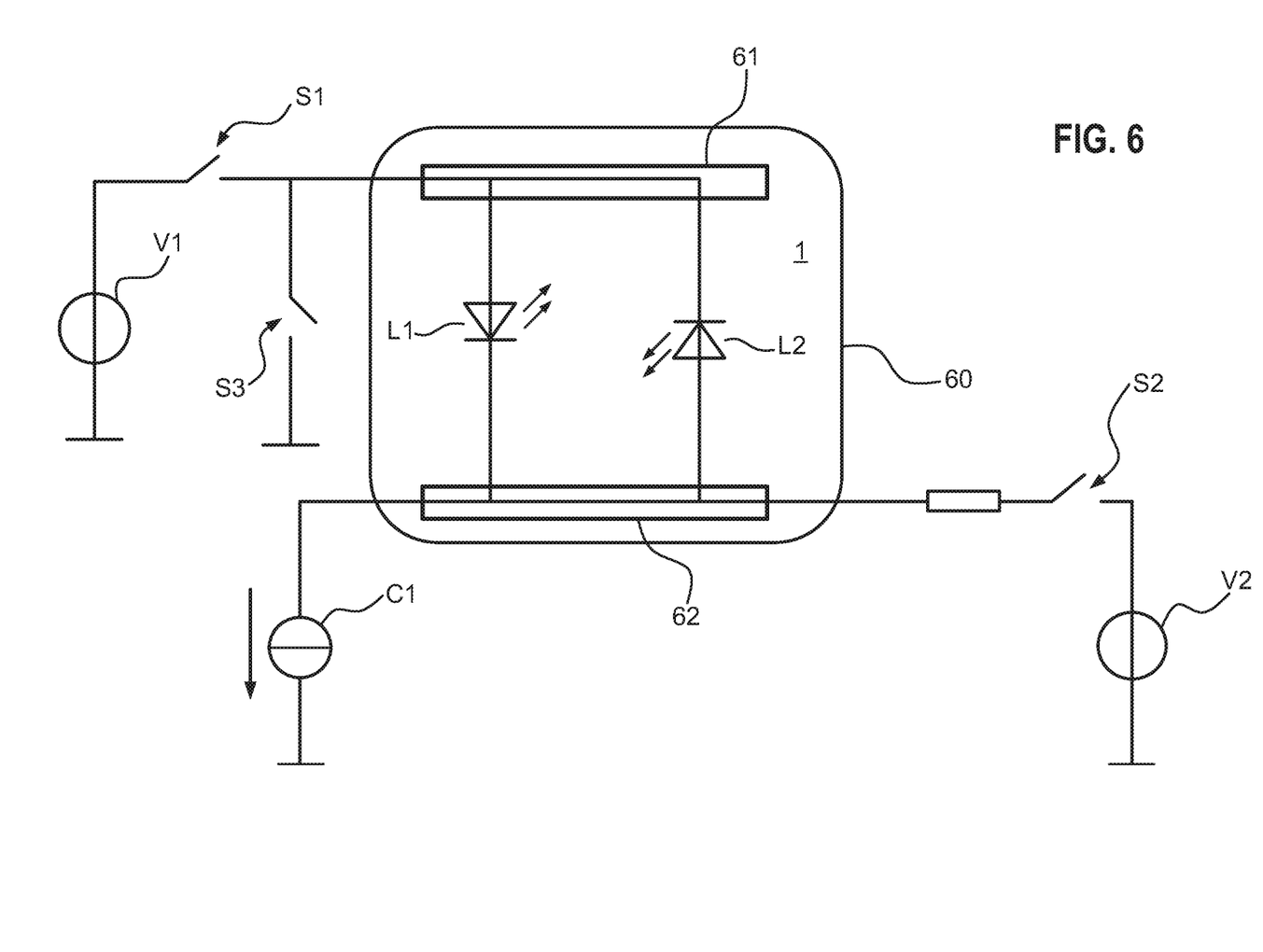
FIG. 6 shows an exemplary circuit diagram for an embodiment of the invention.

FIG. 6 shows an exemplary circuit diagram for an embodiment of the invention. The die 1 comprising the anti-parallel pair of light-emitting diodes L1, L2 is enclosed in a package 60 with two electrode contacts 61, 62. The diagram shows an arrangement of switches S1, S2, S3, voltage sources V1, V2 and a flash current sink C1. The switches are controlled so that current flows either through the first LED L1 or the second LED L2.

Figure 7:
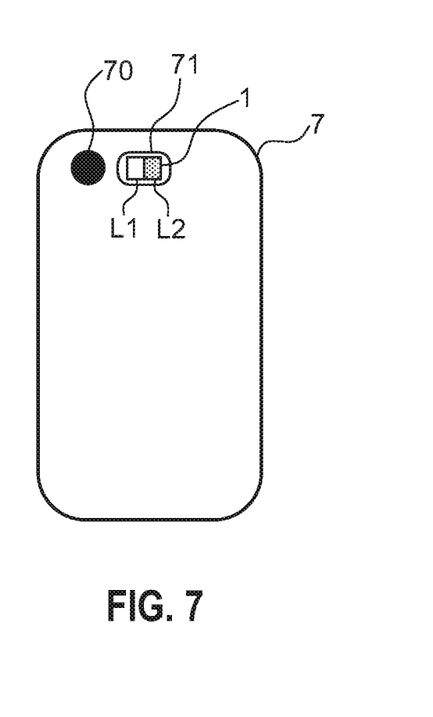
FIG. 7 shows an embodiment of an electronic device 7 according to the invention.

FIG. 7 shows an embodiment of an electronic device 7 according to the invention. The device is a mobile phone with comprising an imaging module. The diagram shows a camera lens 70 of the imaging module and a flash unit 71 comprising an embodiment of the semiconductor die 1 described above. The flash 71 therefore has a first LED L1 (e.g. to illuminate a scene) and a second LED L2 which primarily serves as TVS protection for the first LED L1, but which also has a secondary function such as iris recognition, counterfeit detection, etc. Although the present invention has been disclosed in the form of preferred embodiments and variations thereon, it will be understood that numerous additional modifications and variations could be made thereto without departing from the scope of the invention.

Figure 8:
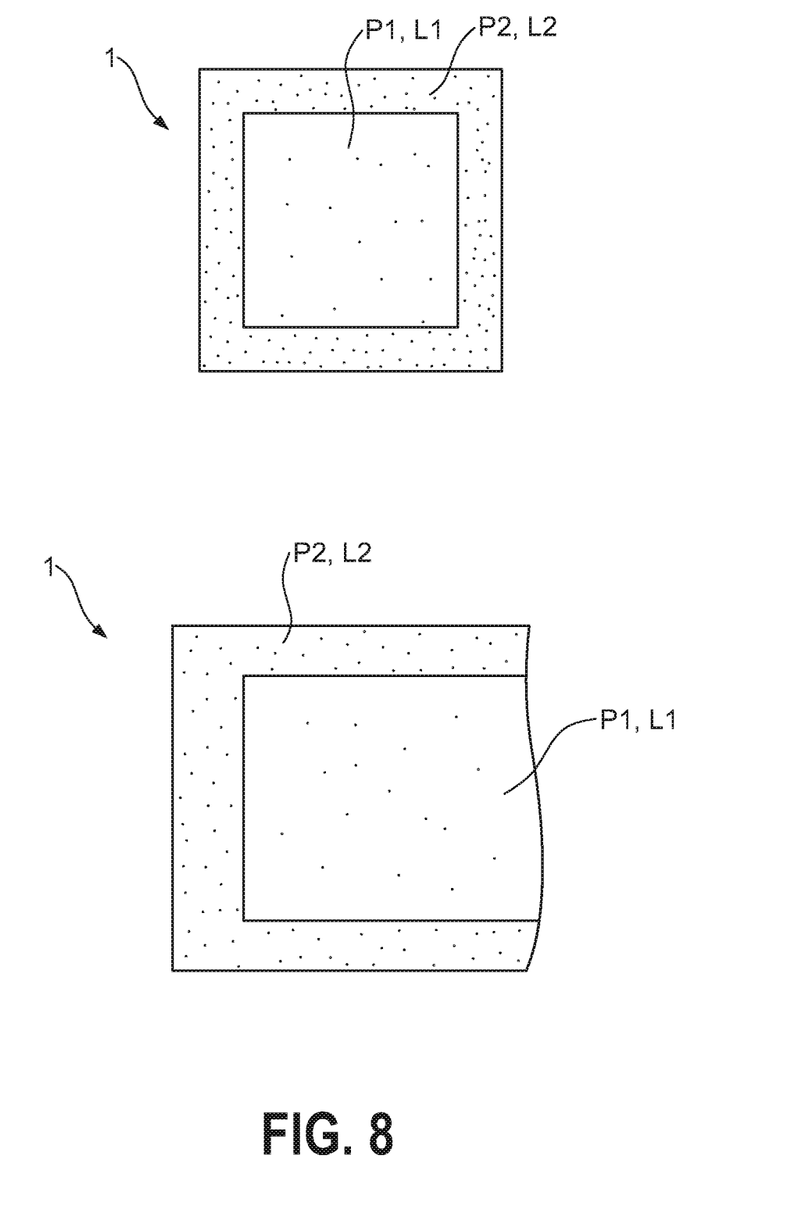
FIG. 8 shows further exemplary embodiments of the inventive semiconductor die.

FIG. 8 shows further exemplary embodiments of the inventive semiconductor die 1. In the upper part of the diagram, a die 1 is realised so that an essentially square or rectangular first light-emitting diode L1 is enclosed on all sides by a narrow second light-emitting diode L2. The phosphor regions P1, P2 are shaped accordingly. In the lower part of the diagram, a die 1 is realised so that an essentially square or rectangular first light-emitting diode L1 is enclosed on three sides by a narrow U-shaped second light-emitting diode L2. The phosphor regions P1, P2 are shaped accordingly.

For the sake of clarity, it is to be understood that the use of "a" or "an" throughout this application does not exclude a plurality, and "comprising" does not exclude other steps or elements.

REFERENCE SIGNS semiconductor die 1
separation layer 10
light-emitting diode L1, L2
diode D1, D2
phosphor layer P1, P2
first spectrum 31
second spectrum 32
wavelength difference $\Delta\lambda$
first die area A1
second die area A2
die package 60
contact pad 61, 62
switch S1, S2, S3
voltage source V1, V2
current sink C1
electronic device 7
camera lens 70
flash arrangement 71

What is claimed is:

1. A semiconductor die comprising: at least a first light-emitting diode that comprises a first diode in a first die area and a first phosphor layer over the first die area, the first light-emitting diode configured to emit electromagnetic radiation in a first wavelength range; and a second light-emitting diode that comprises a second diode in a second die area and a second phosphor layer over the second die area, the second light-emitting diode configured to emit electromagnetic radiation in a second wavelength range that is different from the first wavelength range by at least 200 nm, the first diode and the second diode being electrically connected in parallel with their polarities reversed, and the second phosphor layer and the first phosphor layer having different compositions.

2. The semiconductor die according to claim 1, wherein the first diode and the second diode are each a transient-voltage suppressor for the other of the second diode and the first diode.

3. The semiconductor die according to claim 1, wherein the at least first light-emitting diode emits electromagnetic radiation in a visible spectrum.

4. The semiconductor die according to claim 3, wherein the first phosphor layer of the at least first light-emitting diode comprises any of YAG:Ce; (Y,Lu)AG:Ce and $(Ba,Sr)_2Si_5N_8$:Eu (BSSN); $Sr[LiAl_3N_4]$:$Eu_{2+}$; Eu-activated Ba—Mg-Aluminate; ZnS:Ag; $Sr_3MgSi_2O_8$:Eu; $Y_{3-x}Al_{5-y}Ga_yO_{12}$:$Ce_x$ for which $0.002<x<0.12$ and $0\leq Y\leq 0.4$; $Sr_{1-x-y}Ca_ySiAlN_3$:Eux for which $0.001<x<0.03$ and $0\leq y\leq 1$.

5. The semiconductor die according to claim 1, wherein both the first light-emitting diode and the second light-emitting diode emit electromagnetic radiation in a visible spectrum.

6. The semiconductor die according to claim 4, wherein the second light-emitting diode emits electromagnetic radiation in an infrared range.

7. The semiconductor die according to claim 6, wherein the second phosphor layer of the second light-emitting diode comprises any of $RE_3Ga_{5-x-y}A_xSiO_{14}$:$Cr_y$ (RE=La, Nd, Gd, Yb, Tm; A=Al, Sc), where $0\leq x\leq 1$ and $0.005\leq y\leq 0.1$; $Gd_{3-x}RE_xSc_{2-y-z}Ln_yGa_{3-w}Al_wO_{12}$:$Cr_z$ (Ln=Lu, Y, Yb, Tm; RE=La, Nd), where $0\leq x\leq 3$; $0\leq y\leq 1.5$; $0\leq z\leq 0.3$; and $0\leq w\leq 2$; $AAEM_{1-x}F_6$:$Cr_x$ (A=Li, Cu; AE=Sr, Ca; M=Al, Ga, Sc) where $0.005\leq x\leq 0.2$; $A_{2-x}(WO_4)_3$:$Cr_x$ (A=Al, Ga, Sc, Lu, Yb) where $0.003\leq x\leq 0.5$; $Sc_{1-x-y}A_xBO_3$:$Cr_y$ (A=Ga, Al, In, Lu, Y, Yb) where $0\leq x\leq 1$ and $0.005\leq y\leq 0.1$.

8. The semiconductor die according to claim 7, wherein the first light-emitting diode and the second light-emitting diode emit electromagnetic radiation in a red infrared range.

9. The semiconductor die according to claim 1, wherein the different wavelength ranges differ by at least 250 nm.

10. A method of manufacturing a semiconductor die, comprising: forming a first diode in a first die area and forming a second diode in a second die area such that the first diode and the second diode are connected in parallel with their polarities reversed; depositing a first phosphor layer over the first die area to complete a first light-emitting diode such that the first light-emitting diode is configured to emit electromagnetic radiation in a first wavelength range; and depositing a second phosphor layer over the second die area to complete a second light-emitting diode such that the second light-emitting diode is configured to emit electromagnetic radiation in a second wavelength range different from the first wavelength range by at least 200 nm, and the second phosphor layer and the first phosphor layer having different compositions.

11. The method according to claim 10, wherein the first die area is formed to comprise at least 50% of a total die area.

12. The method according to claim 10, further comprising forming a separation layer between the first light-emitting diode and the second light-emitting diode.

13. The method according to claim 10, wherein the first die area is formed to comprise at least 75% of a total die area.

14. An electronic device comprising: an imaging module that comprises a semiconductor die, the semiconductor die including at least a first light-emitting diode and a second light emitting diode, the first light-emitting diode including a first diode in a first die area and a first phosphor layer over the first die area, and the second light-emitting diode including a second diode in a second die area and a second phosphor layer over the second die area, the first light-emitting diode and the second light-emitting diode configured to emit electromagnetic radiation in wavelength ranges that differ from each other by at least 200 nm, the first diode and the second diode being electrically connected in parallel with their polarities reversed, and the second phosphor layer and the first phosphor layer having different compositions.

15. The electronic device according to claim 14, wherein the semiconductor die is a part of a camera flash arrangement of the imaging module.

* * * * *